United States Patent [19]
Wolf

[11] 3,873,371
[45] Mar. 25, 1975

[54] SMALL GEOMETRY CHARGE COUPLED DEVICE AND PROCESS FOR FABRICATING SAME

[75] Inventor: Edward D. Wolf, Northridge, Calif.

[73] Assignee: Hughes Aircraft Company, Culver City, Calif.

[22] Filed: Nov. 7, 1972

[21] Appl. No.: 304,424

[52] U.S. Cl. .......... 148/1.5, 117/93, 357/91
[51] Int. Cl. .......... H01l 7/54
[58] Field of Search .......... 148/1.5 CP; 117/93; 317/235

[56] References Cited

UNITED STATES PATENTS

| | | | |
|---|---|---|---|
| 2,588,254 | 3/1952 | Lark-Horovitz et al. | 148/1.5 X |
| 2,666,814 | 1/1954 | Shockley | 148/1.5 X |
| 2,900,277 | 8/1959 | Schmitz et al. | 117/93 |
| 3,113,896 | 12/1963 | Mann | 148/1.5 X |
| 3,558,366 | 1/1971 | Lepselter | 148/1.5 |
| 3,622,382 | 11/1971 | Brack et al. | 148/1.5 X |

*Primary Examiner*—L. Dewayne Rutledge
*Assistant Examiner*—J. M. Davis
*Attorney, Agent, or Firm*—William J. Bethurum; William H. MacAllister

[57] ABSTRACT

A metal-oxide-semiconductor (MOS) charge coupled device (CCD) and process for fabricating same wherein initially a selected metallization pattern is formed atop an insulating coating on a semiconductor substrate, and thereafter P or N type ions are implanted through openings in the metallization pattern to form doped regions in the semiconductor substrate, such as "channel stop" regions of a CCD. The ions are implanted at a predetermined angle with respect to the plane of the metallization pattern, so that this angle and the size of the openings in the metallization pattern determine the location of the particular region of the semiconductor substrate into which the ions pass. Thus, the requirement for a separate masking step especially for the purpose of forming these doped regions has been eliminated.

4 Claims, 8 Drawing Figures

SMALL GEOMETRY CHARGE COUPLED DEVICE AND PROCESS FOR FABRICATING SAME

FIELD OF THE INVENTION

Figure 1A:
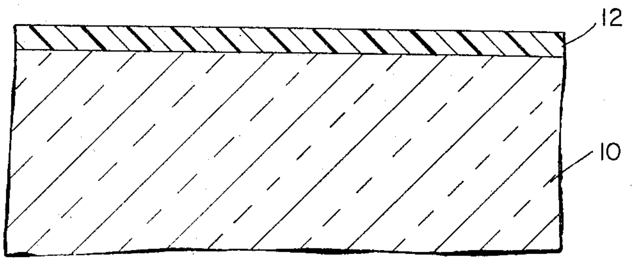

This invention relates generally to charge coupled semiconductor devices and fabrication processes therefor. More particularly, this invention relates to an improved ion implantation process for fabricating very small geometry, high frequency charge coupled devices.

BACKGROUND

Charge coupled semiconductor devices are relatively new in the semiconductor art and have been used only in recent years in certain types of memory and imaging applications. These devices are typically metal-oxide-semiconductor (MOS) constructed devices which operate in response to a plurality of applied gate voltages to laterally move carriers (holes or electrons) in the surface regions of a semiconductor body. These MOS devices operate in response to incident radiation to generate internal voltages which may be sensed at the gate electrodes of the device, or they may be written into and operated, for example, as a shift register in response to applied gate voltages.

In each bit of a CCD shift register, there must be at least three distinct regions of surface potential. One region must receive the charge and is therefore highly attractive to minority carriers. A second region must give up the charge to the receiving region and is therefore biased somewhat less attractive to minority carriers than the first. Finally, in order to prevent charge from flowing backwards to the receiving region of the preceding bit, which is on the same common substrate with the above regions, there must be a blocking region at the input end of each bit which is least attractive to minority carriers. This blocking or "channel stop" region to which it is sometimes referred is usually a heavily doped N+ or P+ channel in the surface region of the semiconductor substrate of the MOS-CCD. Devices of this type are disclosed in some detail by Krambeck et al in *Applied Physics Letters*, Vol. 19, No. 12, Dec. 15, 1971, pages 520–522.

PRIOR ART

In the past, the above channel stop region was formed in MOS charge coupled devices by the use of separate masking and diffusion steps in order to introduce impurities into selected surface regions of the semiconductor body. These latter steps were usually carried out prior to the formation of the gate metallization for the device, and this requirement for separate masking and diffusion steps to form the channel stop or carrier blocking region obviously imposes a limitation on the extent of geometry reduction for the device. Mask alignment and registration tolerances become extremely close as the geometry of these MOS structures is reduced beyond certain limits, and prior art MOS-CCD structures fabricated using conventional photolithographic techniques have been limited to oxide mask openings (line widths) on the order of one to two microns. Thus, it would be highly desirable to eliminate, where possible, any masking steps heretofore required in the fabrication of MOS-CCDs.

THE INVENTION

The general purpose of this invention is to provide a new MOS charge coupled semiconductor device and improved process for fabricating same in which a separate masking step for defining the geometry of the channel stop or carrier blocking region of the device is not required. To attain this purpose, the present process utilizes the MOS gate metallization pattern as a mask through which impurities are introduced into the semiconductor body of a MOS structure at a predetermined angle with respect to the planar surface of the gate metallization. This angle, and the width of the metal mask opening, are chosen such that impurities are introduced into the semiconductor body and at controlled locations beneath the MOS gate metallization. Here these impurities block the lateral flow of minority carriers in the semiconductory body. Thus, the gate metallization serves as a mask for controllably introducing conductivity-type determining impurity ions into the semiconductor body, and no special masking step is required for defining the geometry of an ion-implanted channel stop region.

Accordingly, an object of this invention is to provide a new and improved MOS charge coupled device and process for fabricating same.

Another object is to provide a new and improved process of the type described which requires an absolute minimum of fabrication steps.

Another object is to provide a new and improved process of the type described which is suitable for the fabrication of very small geometry, high frequency structures at high process yields.

DRAWING

Figure 1B:
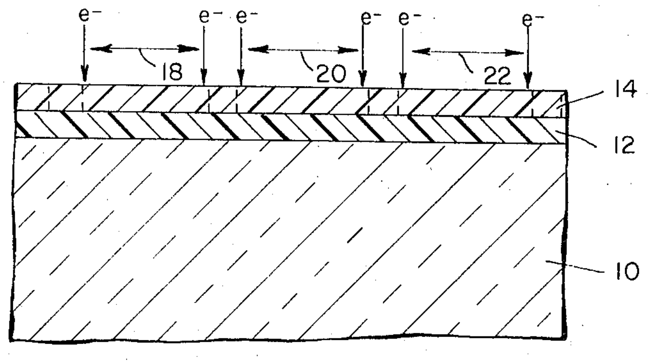
Figure 1C:
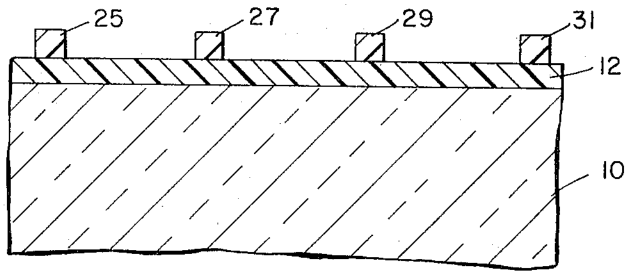
Figure 1D:
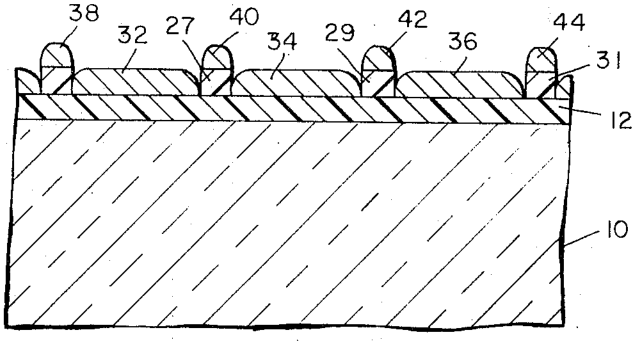
Figure 1E:
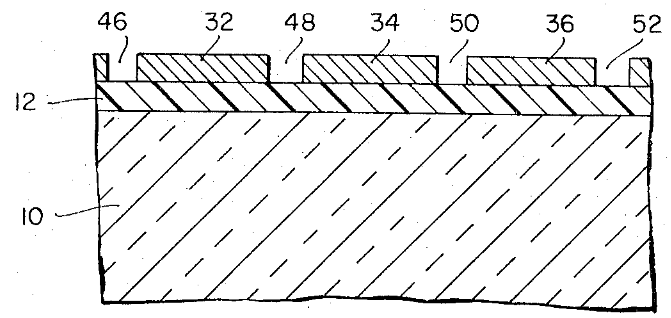
Figure 1F:
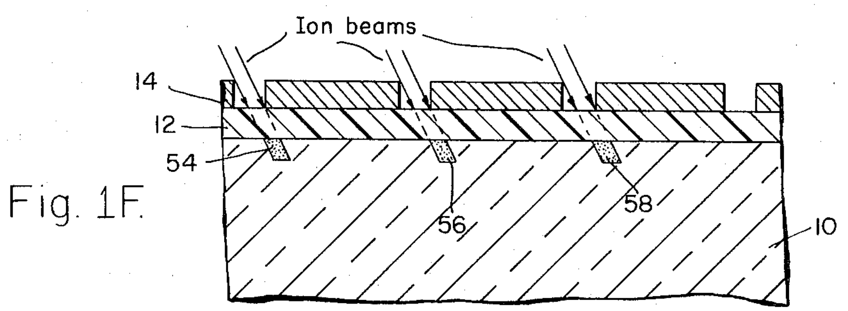
Figure 1G:
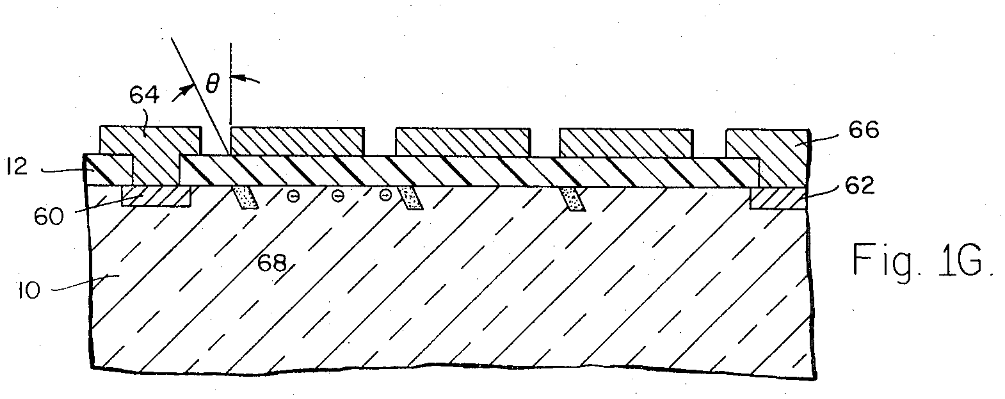
Figure 2:
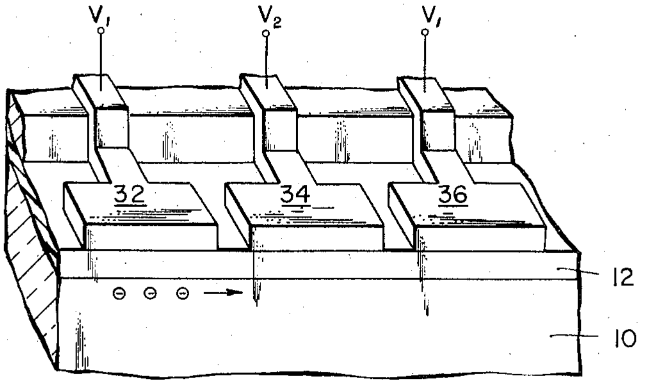

FIGS. 1A–1G illustrate, in cross-section and in process sequence, the different process steps employed in the MOS fabrication process embodying the invention; and FIG. 2 is a perspective view showing typical driver voltage connections for the MOS-CCD of FIG. 1G.

GENERAL PROCESS DESCRIPTION

Referring now to FIG. 1A there is shown a semiconductor body 10, which in the present example is a wafer of P type silicon having a resistivity in the order of 10 ohm. centimeters. This wafer is initially lapped to a desired thickness and polished on one side using conventional silicon wafer processing techniques. Using conventional thermal oxidation processes for forming the surface oxide, a layer 12 of silicon dioxide, $SiO_2$, is formed as shown on the upper surface of the silicon wafer 10. The thickness of the oxide layer 12 is on the order of 2,000 angstroms, and as will be discussed more fully hereinafter, this oxide thickness dimension becomes significant with reference to the width of the openings in the metallization pattern subsequently formed thereon.

Next, a layer 14 of electron beam resist material, such as polymethylmethacrylate (PMM), is deposited by spin-coating as shown in FIG. 1B on the upper surface of the silicon dioxide layer 12. The PMM layer 14, which is a positive resist material, is then exposed in the areas 18, 20, and 22 as shown in FIG. 1B to an electron beam $e^-$. This beam may be focused using conventional and well-known electron beam deflection techniques and projected into selected regions of the PMM resist material 14 as shown in FIG. 1B. In the present process, the portions of the resist 14 which are exposed to the electron beam are chemically altered by bond sission to a lower molecular weight polymer, and these altered portions of the layer 14 may then be dissolved away using, for example, the preferential etchant methyl isobutyl ketone. Thus, when the portions of the electron beam resist layer 14 defined by their respective width dimensions 18, 20, and 22 are dissolved away, the undeveloped resist portions 25, 27, 29, and 31 remain intact as shown in FIG. 1C and are utilized in a subsequent metallization step.

Using conventional metal evaporation techniques, a thin segmented layer of gate metallization, such as aluminum is evaporated over the upper exposed surface areas of the remaining electron beam resist regions 25, 27, 29, and 31 and over the upper exposed surface areas of the $SiO_2$ layer 12. This process step is illustrated in FIG. 1D, and this metallization layer consists of the spaced segments 32, 34, and 36 which adhere directly to the $SiO_2$ layer 12 and the spaced segments 38, 40, 42, and 44 which adhere directly to the upper surfaces of the remaining PMM islands 25, 27, 29, and 31, respectively.

Next, the PMM electron beam resist regions 25, 27, 29, and 31 are dissolved away using, for example, the solvent trichloroethylene. During this dissolution action, portions of the overlying metallization 38, 40, 42 and 44 are simultaneously removed from the surface of the structure shown in FIG. 1D in order to create the openings 46, 48, 50, and 52 in the above-described metallization pattern. These openings are shown in FIG. 1E. It is preferred that the widths of the openings 46, 48, 50, and 52 be made to the same order of magnitude as the thickness of the underlying silicon dioxide layer 12.

The width of the metal mask openings 46, 48, 50, and 52, and the thickness of the segmented metallization layer constitutes the critical mask dimensions for the metallization mask. This mask enables the heavily doped regions 54, 56, and 58 to be formed by "slant" ion-implantation into the wafer 10 at an angle $\theta$ as shown. Typically, the width of the openings 46, 48, 50, and 52 in the metallization pattern will be approximately equal to the thickness of the $SiO_2$ layer 12, which is between about 0.1 and 0.5 microns.

In accordance with the present process, and using conventional state-of-the-art ion implantation techniques, either N type or P type ions are accelerated through the openings 46, 48, 50, and 52 in the metallization mask and through the underlying silicon dioxide 12 to form heavily doped P+ "channel stop" or "carrier blocking" regions 54, 56, and 58 as shown. These ion implantation techniques are described, for example, by J. W. Mayer et al., *Ion Implantation in Semiconductors*, Academic Press, 1970. If the distance across the openings 46, 48, 50 and 52 is equal to the thickness of the $SiO_2$ layer 12, then $\theta = \arctan 0.5$ for the condition where the left edge of each channel stop region 54, 56, or 58 is in perfect alignment with the left edge of each overlying metal electrode 32, 34, or 36, respectively. By increasing the angle $\theta$ for this fixed set of conditions, the barrier regions 54, 56, and 58 may be moved further to the right relative to their positions shown in FIG. 1G. But in this case, the depth of the regions will be reduced for a given dosage of ion implantation doping.

It will be appreciated that for a fixed thickness for the $SiO_2$ layer 12 and for a fixed width for the openings 34, 36, 38, and 40, the extent to which the P+ regions 48, 50, and 52 may be laterally moved under (to the right as shown in FIG. 1F) the metallization layer 32 will depend upon the angle $\theta$. If $\theta$ is increased, the P+ regions may be laterally moved to the right (FIG. 1G) in the silicon substrate 10. For a fixed angle $\theta$, variations in thickness of the $SiO_2$ layer 12 and variations in the width of the openings 34, 36, 38, and 40 can be made in order to correspondingly change the lateral position of the P+ regions 48, 50, and 52 in the silicon substrate 10. Therefore, the present invention affords one a substantial amount of process control and flexibility as regards determining the specific lateral position and depth of the channel stop regions 48, 50, and 52.

The MOS-CCD structure in FIG. 1F is then further processed as illustrated in FIG. 1G to form the input and output diode regions 60 and 62, and these heavily doped N+ regions are preferably formed by ion implantation into the wafer 10. These regions form the input and output PN diodes and being heavily doped, make good ohmic contact to the input and output electrodes 64 and 66. The latter electrodes are formed by a conventional metallization step which is carried out after implanting ions into the wafer to form the above input and output diodes. Packets (minority carriers) of mobile charge are injected into the P type substrate from the N+ region 60 of the input diode and other packets of mobile charge are collected at the N+ region 62 of the output diode. Reference numeral 68 designates electrons or minority carriers which flow laterally between adjacent P+ blocking regions upon the application of suitable control potentials to the gate electrodes 32, 34, and 36.

The charge coupled device in FIG. 2 is a three-dimensional fragmented view of only a portion of FIG. 1G. This gate electrode portion of FIG. 1G is included merely to show how the overlay gate metallization strips typically couple into the MOS-CCD structure of interest. This structure may, for example, be part of a larger memory device, wherein electrons (minority carriers in the P type substrate) are injected into the device by the input PN diode and laterally controlled by the potentials or the gate electrodes 32, 34, and 36. If $V_1$ and $V_2$ are chosen to be appropriate clock signals which are 180° out of phase, the device can be operated as a P channel 2 phase CCD shift register wherein electrons ae moved laterally along the surface regions of the silicon substrate 10 to regions beneath the more positive of the two adjacent gate electrodes. The channel stop regions restrict this lateral charge flow to one direction by preventing minority carriers from returning to the preceding bit.

Various modifications can be made in the above-described process without departing from the scope of this invention. For example, the novel concept of slanting the ion implantation to control the geometry and location of the channel stop regions is not specifically restricted to the use of conductive gate metallization for an ion implantation mask. A silicon gate could be used as the ion implantation mask, in which case the ions would be projected through openings in the silicon gate. Conceivably, still other types of insulating or semi-insulating masks could be used both to mask against the ion implantation and to serve as the gate electrode or as the support for the gate electrode.

What is claimed is:

1. A process for fabricating a semiconductor structure having a channel region therein for blocking the lateral flow of charge carriers, including the steps of:

a. forming an oxide coating on the surface of a semiconductor substrate, b. forming a resist coating on said oxide coating, c. developing selected areas of said resist coating to thereby form a resist pattern, d. depositing a metal film on the exposed areas of both said oxide coating and said resist pattern, e. removing said resist pattern to thereby simultaneously remove the portions of said metal film lying thereon, whereby openings are formed in said metal film, and f. accelerating conductivity-type determining ions through said openings and at a preselected angle with respect to the planar surface of said metallization pattern, whereby said ions are introduced into a region beneath said metallization pattern and there serve as a channel stop or carrier blocking region within said semiconductor substrate, and a separate masking step especially for forming said region is not required.

2. The process defined in claim 1 wherein said resist pattern is an electron beam resist material which is developed by focusing an electron beam on selected areas thereof to achieve very narrow line widths in the fabrication of very small geometry semiconductor devices.

3. The process defined in claiam 1 which further includes:

a. forming said oxide coating with a thickness which approaches the width of the opening in said metallization pattern, and b. controlling the angle at which said ions are accelerated through said opening in said metallization pattern, whereby the depth and lateral position of ion implanted regions may be controlled by varying either said angle, the openings in said metallization pattern, the oxide thickness, or the metallization thickness, or a combination of the latter, thereby imparting substantial process control and flexibility to said process.

4. In a process for fabricating a metal-oxide-semiconductor field effect structure wherein a gate metallization pattern is deposited in a predetermined spaced relationship above the surface of a semiconductor body, so that a voltage applied to said gate metallization serves to control the electric field in said semiconductor body and the flow of charge carriers therein, the improvement comprising accelerating conductivity-type determining ions through openings in said metallization pattern and at a preselected angle with respect to the planar surface of said metallization pattern, whereby said ions are projected into a region of said semiconductor body beneath said metallization pattern and there serve as a channel stop or carrier blocking region, and a separate masking step other than the step forming said gate metallization pattern is not required for forming said channel stop or carrier blocking region.

* * * * *